(12) United States Patent
Hang

(10) Patent No.: US 8,512,463 B2
(45) Date of Patent: *Aug. 20, 2013

(54) THICK FILM PASTE CONTAINING BISMUTH-TELLURIUM-OXIDE AND ITS USE IN THE MANUFACTURE OF SEMICONDUCTOR DEVICES

(75) Inventor: Kenneth Warren Hang, Cary, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/438,093

(22) Filed: Apr. 3, 2012

(65) Prior Publication Data

US 2013/0092051 A1    Apr. 18, 2013

Related U.S. Application Data

(60) Provisional application No. 61/486,826, filed on May 17, 2011, provisional application No. 61/471,866, filed on Apr. 5, 2011.

(51) Int. Cl.
*C09D 1/00* (2006.01)
*C01G 29/00* (2006.01)
*H01L 31/0272* (2006.01)

(52) U.S. Cl.
USPC .............. 106/286.4; 106/286.6; 106/286.7; 106/286.8

(58) Field of Classification Search
USPC ............. 106/286.4, 286.6, 286.7, 286.8
See application file for complete search history.

(56) References Cited

U.S. PATENT DOCUMENTS

| | | | |
|---|---|---|---|
| 5,188,990 A * | 2/1993 | Dumesnil et al. | 501/19 |
| 6,266,181 B1 * | 7/2001 | Ohishi et al. | 359/341.1 |
| 2006/0289055 A1 | 12/2006 | Sridharan et al. | |
| 2009/0018006 A1 * | 1/2009 | Ueda et al. | 501/46 |
| 2009/0188555 A1 | 7/2009 | Castillo et al. | |
| 2009/0189126 A1 | 7/2009 | Prunchak | |
| 2011/0192457 A1 | 8/2011 | Nakayama et al. | |
| 2012/0305858 A1 * | 12/2012 | Hang et al. | 252/514 |

FOREIGN PATENT DOCUMENTS

| | | |
|---|---|---|
| CN | 101164943 A | 4/2008 |
| EP | 1713092 A2 | 10/2006 |
| JP | 5128910 A | 5/1993 |
| JP | 2010283340 A | 12/2010 |
| KR | 2010070166 A | 6/2010 |
| WO | 92/00925 A1 | 1/1992 |
| WO | 2011/026769 A1 | 3/2011 |
| WO | 2011/026852 A1 | 3/2011 |

OTHER PUBLICATIONS

EL0990WOPCT Search Report.
EL0990WOPCT1 Search Report.

* cited by examiner

*Primary Examiner* — Anthony J Green

(57) ABSTRACT

The present invention is directed to an electroconductive thick film paste composition comprising Ag and a Pb-free bismuth-tellurium-oxide both dispersed in an organic medium. The present invention is further directed to an electrode formed from the paste composition and a semiconductor device and, in particular, a solar cell comprising such an electrode. The present invention is also directed to the bismuth-tellurium oxide that is a component of thick film pastes.

7 Claims, 2 Drawing Sheets

US 8,512,463 B2

THICK FILM PASTE CONTAINING BISMUTH-TELLURIUM-OXIDE AND ITS USE IN THE MANUFACTURE OF SEMICONDUCTOR DEVICES

FIELD OF THE INVENTION

The present invention is directed primarily to a thick film paste composition and thick film electrodes formed from the composition. It is further directed to a silicon semiconductor device and, in particular, it pertains to the electroconductive composition used in the formation of a thick film electrode of a solar cell. The present invention is also directed to a bismuth-tellurium oxide that serves as a component of thick film pastes.

TECHNICAL BACKGROUND OF THE INVENTION

The present invention can be applied to a broad range of semiconductor devices, although it is especially effective in light-receiving elements such as photodiodes and solar cells. The background of the invention is described below with reference to solar cells as a specific example of the prior art.

A conventional solar cell structure with a p-type base has a negative electrode that is typically on the front-side or sun side of the cell and a positive electrode on the back side. Radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metallized, i.e., provided with metal electrodes that are electrically conductive. Typically thick film pastes are screen printed onto substrate and fired to form the electrodes.

An example of this method of production is described below in conjunction with FIGS. 1A-1F.

FIG. 1A shows a single crystal or multi-crystalline p-type silicon substrate 10.

In FIG. 1B, an n-type diffusion layer 20 of the reverse conductivity type is formed by the thermal diffusion of phosphorus using phosphorus oxychloride as the phosphorus source. In the absence of any particular modifications, the diffusion layer 20 is formed over the entire surface of the silicon p-type substrate 10. The depth of the diffusion layer can be varied by controlling the diffusion temperature and time, and is generally formed in a thickness range of about 0.3 to 0.5 microns. The n-type diffusion layer may have a sheet resistivity of several tens of ohms per square up to about 120 ohms per square.

After protecting the front surface of this diffusion layer with a resist or the like, as shown in FIG. 1C the diffusion layer 20 is removed from the rest of the surfaces by etching so that it remains only on the front surface. The resist is then removed using an organic solvent or the like.

Then, as shown in FIG. 1D an insulating layer 30 which also functions as an anti-reflection coating is formed on the n-type diffusion layer 20. The insulating layer is commonly silicon nitride, but can also be a $SiN_x$:H film (i.e., the insulating film comprises hydrogen for passivation during subsequent firing processing), a titanium oxide film, a silicon oxide film, or a silicon oxide/titanium oxide film. A thickness of about 700 to 900 Å of a silicon nitride film is suitable for a refractive index of about 1.9 to 2.0. Deposition of the insulating layer 30 can be by sputtering, chemical vapor deposition, or other methods.

Next, electrodes are formed. As shown in FIG. 1E, a silver paste 500 for the front electrode is screen printed on the silicon nitride film 30 and then dried. In addition, a back side silver or silver/aluminum paste 70, and an aluminum paste 60 are then screen printed onto the back side of the substrate and successively dried. Firing is carried out in an infrared furnace at a temperature range of approximately 750 to 850° C. for a period of from several seconds to several tens of minutes.

Consequently, as shown in FIG. 1F, during firing, aluminum diffuses from the aluminum paste 60 into the silicon substrate 10 on the back side thereby forming a p+ layer 40 containing a high concentration of aluminum dopant. This layer is generally called the back surface field (BSF) layer, and helps to improve the energy conversion efficiency of the solar cell.

Firing converts the dried aluminum paste 60 to an aluminum back electrode 61. The back side silver or silver/aluminum paste 70 is fired at the same time, becoming a silver or silver/aluminum back electrode, 71. During firing, the boundary between the back side aluminum and the back side silver or silver/aluminum assumes the state of an alloy, thereby achieving electrical connection. Most areas of the back electrode are occupied by the aluminum electrode 61, owing in part to the need to form a p+ layer 40. Because soldering to an aluminum electrode is impossible, the silver or silver/aluminum back electrode 71 is formed over portions of the back side as an electrode for interconnecting solar cells by means of copper ribbon or the like. In addition, the front side silver paste 500 sinters and penetrates through the silicon nitride film 30 during firin, and thereby achieves electrical contact with the n-type layer 20. This type of process is generally called "fire through." The fired electrode 501 of FIG. 1F clearly shows the result of the fire through.

There is an on-going effort to provide thick film paste compositions that have reduced amounts of silver and are Pb-free while at the same time maintaining electrical performance and other relevant properties of the resulting electrodes and devices. The present invention provides a Ag paste composition that simultaneously provides a Pb-free system with lower amounts of Ag while still maintaining electrical and mechanical performance.

SUMMARY OF THE INVENTION

The present invention provides a thick film paste composition comprising:
(a) 35-55 wt % Ag;
(b) 0.5-5 wt % Pb-free bismuth-tellurium-oxide; and
(c) organic medium;
wherein the Ag and the bismuth-tellurium-oxide are dispersed in the organic medium and wherein the wt % are based on the total weight of the paste composition, the bismuth-tellurium oxide comprising 22-42 wt % $Bi_2O_3$ and 58-78 wt % $TeO_2$, based on the total weight of the bismuth-tellurium oxide.

The invention also provides a semiconductor device, and in particular, a solar cell comprising an electrode formed from the instant paste composition, wherein the paste composition has been fired to remove the organic medium and form the electrode.

The invention further provides the bismuth-tellurium oxide comprising 22-42 wt % $Bi_2O_3$ and 58-78 wt % $TeO_2$, based on the total weight of the bismuth-tellurium oxide, wherein the bismuth-tellurium oxide is Pb-free.

DETAILED DESCRIPTION OF THE INVENTION

Figure 1A:
FIGS. 1A-1F illustrate the fabrication of a semiconductor device. Reference numerals shown in FIG. 1 are explained below.
- 10: p-type silicon substrate
- 20: n-type diffusion layer
- 30: silicon nitride film, titanium oxide film, or silicon oxide film
- 40: p+ layer (back surface field, BSF)
- 60: aluminum paste formed on back side
- 61: aluminum back side electrode (obtained by firing back side aluminum paste)
- 70: silver/aluminum paste formed on back side
- 71: silver/aluminum back side electrode (obtained by firing back side silver/aluminum paste)
- 500: silver paste formed on front side
- 501: silver front electrode (formed by firing front side silver paste)
Figure 1B:
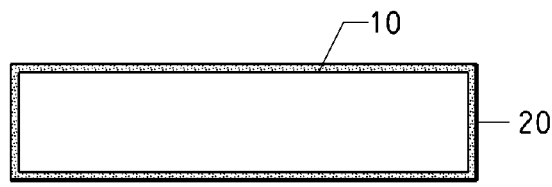
Figure 1C:
Figure 1D:
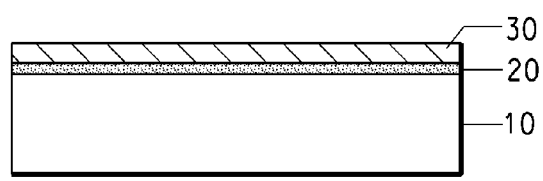
Figure 1E:
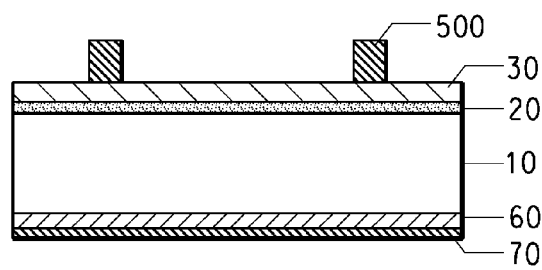
Figure 1F:
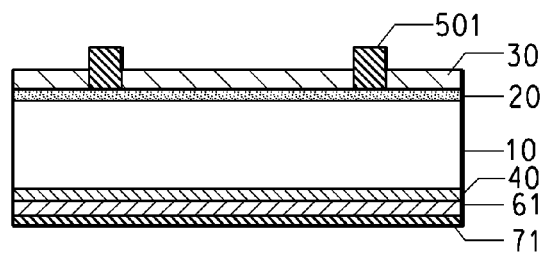

The conductive thick film paste composition of the instant invention contains a reduced amount of silver but simultaneously provides the ability to form an electrode from the paste wherein the electrode has good electrical and adhesion properties.

The conductive thick film paste composition comprises silver, a bismuth-tellurium-oxide that is Pb-free, and an organic vehicle. It is used to form screen printed electrodes and, particularly, to form tabbing electrodes on the back side on the silicon substrate of a solar cell. The paste composition comprises 35-55 wt % silver, 0.5-5 wt % bismuth-tellurium oxide and an orgainic medium, wherein the Ag and the bismuth-tellurium oxide are both dispersed in the organic medium and wherein the weight percentages are based on the total weight of the paste composition.

Each component of the thick film paste composition of the present invention is explained in detail below.

Silver

In the present invention, the conductive phase of the paste is silver (Ag). The silver can be in the form of silver metal, alloys of silver, or mixtures thereof. Typically, in a silver powder, the silver particles are in a flake form, a spherical form, a granular form, a crystalline form, other irregular forms and mixtures thereof. The silver can be provided in a colloidal suspension. The silver can also be in the form of silver oxide ($Ag_2O$), silver salts such as AgCl, $AgNO_3$, AgOOCCH$_3$ (silver acetate), $AgOOCF_3$ (silver trifluoroacetate), silver orthophosphate ($Ag_3PO_4$), or mixtures thereof. Other forms of silver compatible with the other thick-film paste components can also be used.

In one embodiment, the thick-film paste composition comprises coated silver particles that are electrically conductive. Suitable coatings include phosphorous and surfactants. Suitable surfactants include polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The salt counter-ions can be ammonium, sodium, potassium, and mixtures thereof.

The particle size of the silver is not subject to any particular limitation. In one embodiment, an average particle size is less than 10 microns; in another embodiment, the average particle size is less than 5 microns.

As a result of its cost, it is advantageous to reduce the amount of silver in the paste while maintaining the required properties of the paste and the electrode formed from the paste. In addition, the instant thick film paste enables the formation of electrodes with reduced thickness, resulting in further savings. The instant thick film paste composition comprises 35-55 wt % silver, based on the total weight of the paste composition. In one embodiment the thick film paste composition comprises 38-52 wt % silver.

Bismuth-Tellurium-Oxide

A component of the paste composition is a lead-free bismuth-tellurium-oxide (Bi—Te—O). In an embodiment, this oxide may be a glass composition, e.g., a glass frit. In a further embodiment, this oxide may be crystalline, partially crystalline, amorphous, partially amorphous, or combinations thereof. In an embodiment, the Bi—Te—O may include more than one glass composition. In an embodiment, the Bi—Te—O composition may include a glass composition and an additional composition, such as a crystalline composition.

The bismuth-tellurium-oxide (Bi—Te—O) may be prepared by mixing $Bi_2O_3$, $TeO_2$ and other oxides to be incorporated therein (or other materials that decompose into the desired oxides when heated) using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of bismuth, tellurium, and other oxides to be incorporated therein is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $d_{50}$ of 0.1 to 3.0 microns. One skilled in the art of producing glass frit may employ alternative synthesis techniques such as but not limited to water quenching, sol-gel, spray pyrolysis, or others appropriate for making powder forms of glass.

The oxide product of the above process is typically essentially an amorphous (non-crystalline) solid material, i.e., a glass. However, in some embodiments the resulting oxide may be amorphous, partially amorphous, partially crystalline, crystalline or combinations thereof. As used herein "glass frit" includes all such products.

The starting mixture used to make the Bi—Te—O includes, based on the total weight of the starting mixture of the Bi—Te—O, 22 to 42 wt % $Bi_2O_3$ and 58 to 78 wt % $TeO_2$.

In a further embodiment, in addition to the $Bi_2O_3$ and $TeO_2$, the starting mixture used to make the Bi—Te—O includes 0.1 to 7 wt % $Li_2O$ and 0.1 to 4 wt % $TiO_2$, based on the total weight of the starting mixture of the Bi—Te—O. In a still further embodiment, the starting mixture includes 0.1 to 8 wt % $B_2O_3$, 0.1 to 3 wt % ZnO and 0.3 to 2 wt % $P_2O_5$, again based on the total weight of the starting mixture of the Bi—Te—O.

In another embodiment, in addition to the $Bi_2O_3$ and $TeO_2$, the starting mixture used to make the Bi—Te—O includes 0.9 to 5 wt % $Li_2O$ and 0.3 to 2 wt % $TiO_2$, based on the total weight of the starting mixture of the Bi—Te—O. In a yet a further embodiment, the starting mixture includes 0.9 to 6 wt % $B_2O_3$, 0.1 to 2 wt % ZnO and 0.3 to 1 wt % $P_2O_5$, again based on the total weight of the starting mixture of the Bi—Te—O.

In one embodiment, the Bi—Te—O may be a homogenous powder. In a further embodiment, the Bi—Te—O may be a combination of more than one powder, wherein each powder may separately be a homogenous population. The composition of the overall combination of the 2 powders is within the ranges described above. For example, the Bi—Te—O may include a combination of 2 or more different powders; separately, these powders may have different compositions, and may or may not be within the ranges described above; however, the combination of these powders may be within the ranges described above.

In an embodiment, the Bi—Te—O composition may include one powder which includes a homogenous powder including some but not all of the desired elements of the Bi—Te—O composition, and a second powder, which includes one or more of the other desired elements. For example, a Bi—Te—O composition further comprising Li and Ti may include a first powder including Bi, Te, Li, and O, and a second powder including $TiO_2$. In an aspect of this embodiment, the powders may be melted together to form a uniform composition. In a further aspect of this embodiment, the powders may be added separately to a thick film composition.

In an embodiment, some or all of any $Li_2O$ may be replaced with $Na_2O$, $K_2O$, $Cs_2O$, or $Rb_2O$, resulting in a glass composition with properties similar to the compositions listed above.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of ordinary skill in the art in glass chemistry, a certain portion of volatile species may be released during the process of making the glass. An example of a volatile species is oxygen. It should also be recognized that while the glass behaves as an amorphous material it will likely contain minor portions of a crystalline material.

If starting with a fired glass, one of ordinary skill in the art may calculate the percentages of starting components described herein using methods known to one of skill in the art including, but not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; electron microprobe Energy Dispersive Spectroscopy (EDS); electron microprobe Wavelength Dispersive Spectroscopy (WDS); Cathodo-Luminescence (CL).

One of ordinary skill in the art would recognize that the choice of raw materials could unintentionally include impurities that may be incorporated into the glass during processing. For example, the impurities may be present in the range of hundreds to thousands ppm.

The presence of the impurities would not alter the properties of the glass, the thick film composition, or the fired device. For example, a solar cell containing the thick-film composition may have the efficiency described herein, even if the thick-film composition includes impurities.

The content of the Bi—Te—O in the instant thick film paste composition is typically 0.5-5 wt %, based on the total weight of the thick film paste composition. In one embodiment, the content is 1-3.5 wt %. The Bi—Te—O is a necessary component of the instant paste composition but also can play an important role as a component in other thick film paste formulations.

Organic Medium

The inorganic components of the thick-film paste composition are mixed with an organic medium to form viscous pastes having suitable consistency and rheology for printing. A wide variety of inert viscous materials can be used as the organic medium. The organic medium can be one in which the inorganic components are dispersible with an adequate degree of stability during manufacturing, shipping and storage of the pastes, as well as on the printing screen during the screen-printing process.

Suitable organic media have rheological properties that provide stable dispersion of solids, appropriate viscosity and thixotropy for screen printing, appropriate wettability of the substrate and the paste solids, a good drying rate, and good firing properties. The organic medium can contain thickeners, stabilizers, surfactants, and/or other common additives. One such thixotropic thickener is thixatrol. The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also comprise volatile liquids to promote rapid hardening after application of the thick-film paste composition on a substrate.

The optimal amount of organic medium in the thick-film paste composition is dependent on the method of applying the paste and the specific organic medium used. The instant thick-film paste composition contains 35 to 60 wt % of organic medium, based on the total weight of the paste composition.

If the organic medium comprises a polymer, the polymer typically comprises 8 to 15 wt % of the organic composition.

Inorganic Additives

The Bi—Ti—O used in the composition of the present invention provides adhesion. However, an inorganic adhesion promoter may be added to increase adhesion characteristics. This inorganic additive may be selected from the group consisting of $Bi_2O_3$, $TiO_2$, $Al_2O_3$, $B_2O_3$, $SnO_2$, $Sb_2O_5$, $Cr_2O_3$, $Fe_2O_3$, ZnO, CuO, $Cu_2O$, $MnO_2$, $Co_2O_3$, NiO, $RuO_2$, a metal that can generate a listed metal oxide during firing, a metal compound that can generate a listed metal oxide during firing, and mixtures thereof. The additive can help increase adhesion characteristics without affecting electrical performance and bowing.

The average diameter of the inorganic additive is in the range of 0.5-10.0 μm, or dispersed to the molecular level when the additives are in the form of organo-metallic compounds. The amount of additive to be added to the paste composition is 0.5-5 wt %, based on the total weight of the paste composition.

In still another embodiment, the paste further comprises 1-5 wt % aluminum (Al), based on the total weight of the paste composition. The Al is preferably in the powder form.
Preparation of the Thick Film Paste Composition In one embodiment, the thick film paste composition can be prepared by mixing Ag powder, the Bi—Te—O powder, and the organic medium and any inorganic additive in any order. In some embodiments, the inorganic materials are mixed first, and they are then added to the organic medium. In other embodiments, the Ag powder which is the major portion of the inorganics is slowly added to the organic medium. The viscosity can be adjusted, if needed, by the addition of solvents. Mixing methods that provide high shear are useful. The thick film paste contains less than 70 wt % of inorganic components, i.e., the Ag powder, the Bi—Te—O powder and any inorganic additives, based on the total weight of the paste composition. In one embodiment the thick film paste contains less than 60 wt % of inorganic components The thick film paste composition can be deposited by screen-printing, plating, extrusion, inkjet, shaped or multiple printing, or ribbons.

In this electrode-forming process, the thick film paste composition is first dried and then heated to remove the organic medium and sinter the inorganic materials. The heating can be carried out in air or an oxygen-containing atmosphere. This step is commonly referred to as "firing." The firing temperature profile is typically set so as to enable the burnout of organic binder materials from the dried thick film paste composition, as well as any other organic materials present. In one embodiment, the firing temperature is 750 to 950° C. The firing can be conducted in a belt furnace using high transport rates, for example, 100-500 cm/min, with resulting hold-up times of 0.05 to 5 minutes. Multiple temperature zones, for example 3 to 11 zones, can be used to control the desired thermal profile.

An example in which a solar cell is prepared using the paste composition of the present invention is explained with reference to FIGS. 2A-2D.

Figure 2A:
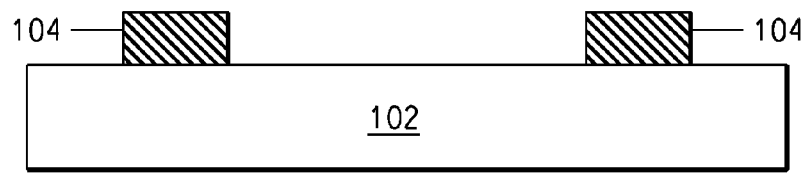
FIGS. 2 A-D explain the manufacturing process of one embodiment for manufacturing a solar cell using the electroconductive paste of the present invention. Reference numerals shown in FIG. 2 are explained below.
- 102 silicon substrate with diffusion layer and an anti-reflection coating
- 104 light-receiving surface side electrode
- 106 paste composition for Al electrode
- 108 paste composition of the invention for tabbing electrode
- 110 Al electrode
- 112 tabbing electrode
Figure 2B:
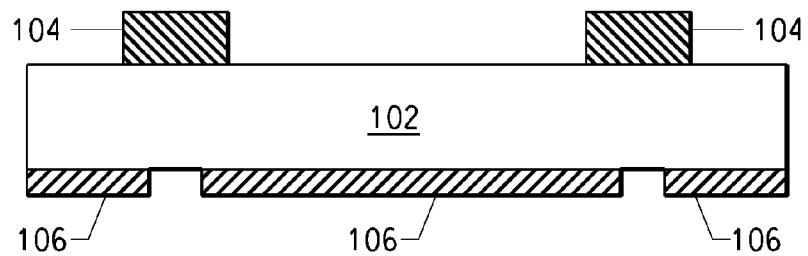
Figure 2C:
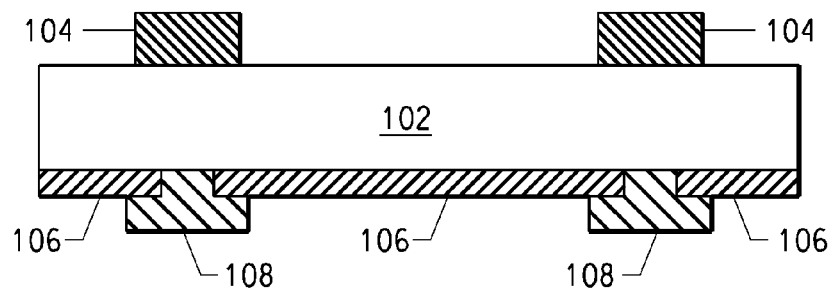

First, a Si substrate 102 with a diffusion layer and an anti-reflection coating is prepared. On the light-receiving front side face (surface) of the Si substrate, electrodes 104 typically mainly composed of Ag are installed as shown in FIG. 2A. On the back face of the substrate, aluminum paste, for example, PV333, PV322 (commercially available from the DuPont co., Wilmington, Del.), is spread by screen printing and then dried 106 as shown in FIG. 2B. The paste composition of the present invention is then spread in a partially overlapped state with the dried aluminum paste and is then dried 108 as shown in FIG. 2C. The drying temperature of each paste is preferably 150° C. or lower. Also, the overlapped part of the aluminum paste and the paste of the invention is preferably about 0.5-2.5 mm.

Figure 2D:
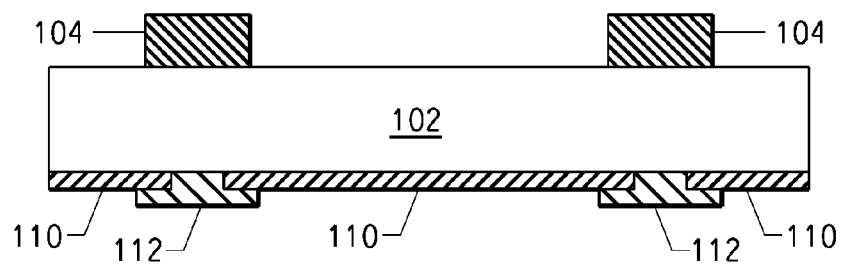

Next, the substrate is fired at a temperature of 700-950° C. for about 1-15 min so that the desired solar cell is obtained as shown in FIG. 2D. The electrodes 112 are formed from the paste composition of the present invention wherein the composition has been fired to remove the organic medium and sinter the inorganics. The solar cell obtained has electrodes 104 on the light-receiving front side of the substrate 102, and Al electrodes 110 mainly composed of Al and electrodes 112 composed of the fired paste composition of the present invention on the back face. The electrodes 112 serve as a tabbing electrode on the back side of the solar cell.

EXAMPLES

Example 1

Bismuth-tellurium-oxide Preparation

A bismuth-tellurium-oxide (Bi—Te—O) composition was prepared by mixing and blending $Bi_2O_3$, $TeO_2$, $Li_2CO_3$, $TiO_2$, $B_2O_3$, $BPO_4$ (or $LiPO_3$) and ZnO powders to result in a Bi—Te—O composition comprising 26.64 wt % $Bi_2O_3$, 67.22 wt % $TeO_2$, 2.16 wt % $LiO_2$, 0.48 wt % $TiO_2$, 2.09 wt % $B_2O_3$, 0.98 wt % ZnO and 0.43 wt % $P_2O_5$. The blended powder batch materials were loaded to a platinum alloy crucible then inserted into a furnace and heated at 900° C. in air or $O_2$ for one hour to melt the mixture. The liquid melt was quenched from 900° C. by removing the platinum crucible from the furnace and pouring the melt through counter rotating a stainless steel rollers gapped to 0.010-0.020". The resulting material was coarsely crushed in a stainless steel container. The crushed material was then ball-milled in an alumina-silicate ceramic ball mill with zirconia media and water until the $d_{50}$ was 0.5-0.7 microns. The ball-milled material was then separated from the milling balls, wet screened and dried by hot air oven. The dried powder was run through a 200 mesh screen to provide the Bi—Te—O powder used in the thick film paste preparations described below. X-ray analysis of the powder showed a characteristic of an amorphous material. The material was characterized by Thermomechanical Analysis (TMA) and shows an onset of particle sintering at 320° C. which transitions to fully viscous flow at 353° C. The liquidus for the composition appears to be near 511° C. (between 320° C. and 511° C. some crystalline phases may be transiently formed and re-dissolved in the region between sintering onset and the liquidus temperature).
Thick Film Paste Composition Preparation The thick film paste was prepared by mixing Ag, the Bi—Te—O powder prepared above in Example 1, organic medium, Thixatrol® (Elementis Specialities, Inc., Hightstown, N.J.) and adhesion promoters. The Ag, the Bi—Te—O and the adhesion promoters were added to the organic medium and the Thixatrol® with continued stirring. Since the silver was the major portion of the solids it was added slowly to insure better wetting. The paste was then passed through a three-roll mill at a 1 mil gap several times. The degree of dispersion was measured by fine of grind (FOG) to insure that the FOG was less than or equal to 20/10.

The proportions of ingredients used in this Example were 50 wt % Ag, 2 wt % Bi—Te—O, 45.25 wt % organic medium, 0.75 wt % thixatrol, and 2.0 wt % inorganic adhesion promoter made up of 1.0 wt % ZnO, 0.6 wt % $Bi_2O_3$ and 0.4 wt % Cu.
Test Electrodes In order to determine the adhesion properties of electrodes formed from the instant paste composition, the paste composition was screen printed onto a silicon wafer surface in the form of an electrode. The paste was then dried and fired in a furnace. The dried thickness of the sample was 3 μm.
Test Procedure-Adhesion After firing, a solder ribbon was soldered to the fired paste. Since the current invention comprises only Pb-free Bi—Te—O, Pb-free solder was used. The Pb-free solder used was 96.5Sn/3.5Ag. Solder temperature for the Pb-free solder was in the range of 345-375° C., solder time was 5-7s. Flux used was MF200.

The soldered area was approximately 2 mm×2 mm. The adhesion strength was obtained by pulling the ribbon at an angle of 90° to the surface of the cell. An assessment of the adhesion strength was assigned as low, adequate, or good, based on the assumption that an adhesion strength less than 200 g is considered low; values in the range of 200 g to 300 g is adequate, values in the range of 300 to 400 or above is good.

Adhesion was determined for the as-prepared sample of Example 1 and the average of 18 measurements was 674 g. The sample was then aged in an atmosphere with 85% humidity and a temperature of 85° C. After 68 hours the average adhesion of 18 measurements was 335 g.

Example 2

Example 2 was carried out as described in Example 1 except that the paste was prepared using 50 wt % Ag, 1.4 wt % Bi—Te—O, 45.85 wt % organic medium, 0.75 wt % Thixatrol®, and 2.0 wt % inorganic adhesion promoter made up of 1.0 wt % ZnO, 0.6 wt % $Bi_2O_3$ and 0.4 wt % Cu. The dried thickness of the sample was 3 μm.

Adhesion was determined for the sample of Example 2 as described in Example 1. The average adhesion for the as-prepared sample was 741 g. The sample was then aged in an atmosphere with 85% humidity and a temperature of 85° C. After 68 hours the average adhesion was 492 g.

Example 3

Example 3 was carried out as described in Example 1 except that the paste was prepared using 40 wt % Ag, 2.0 wt % Bi—Te—O, 55.25 wt % organic medium, 0.75 wt % Thixatrol®, and 2.0 wt % inorganic adhesion promoter made up of 1.0 wt % ZnO, 0.6 wt % $Bi_2O_3$ and 0.4 wt % Cu. The dried thickness of the sample was 3 μm.

Adhesion was determined for the sample of Example 3 as described in Example 1. The average adhesion for the as-prepared sample was 680 g. The sample was then aged in an atmosphere with 85% humidity and a temperature of 85° C. After 68 hours the average adhesion was 346 g.

Example 4

Example 4 was carried out as described in Example 1 except that the paste was prepared using 40 wt % Ag, 1.4 wt % Bi—Te—O, 55.85 wt % organic medium, 0.75 wt % Thixatrol®, and 2.0 wt % inorganic adhesion promoter made up of 1.0 wt % ZnO, 0.6 wt % $Bi_2O_3$ and 0.4 wt % Cu. The dried thickness of the sample was 3 μm.

Adhesion was determined for the sample of Example 4 as described in Example 1. The average adhesion for the as-prepared sample was 494 g. The sample was then aged in an atmosphere with 85% humidity and a temperature of 85° C. After 68 hours the average adhesion was 346 g.

Example 5

Example 5 was carried out as described in Example 1. The dried thickness of the sample was 2.9 μm.

Adhesion was determined for the sample of Example 5 as described in Example 1. The average adhesion for the as-prepared sample was 802 g.

Example 6

Example 6 was carried out as described in Example 1 except that the paste was prepared using 50 wt % Ag, 3.3 wt % Bi—Te—O, 43.95 wt % organic medium, 0.75 wt % Thixatrol®, and 2.0 wt % inorganic adhesion promoter made up of 1.0 wt % ZnO, 0.6 wt % $Bi_2O_3$ and 0.4 wt % Cu. The dried thickness of the sample was 3.0 μm.

Adhesion was determined for the sample of Example 6 as described in Example 1. The average adhesion for the as-prepared sample was 826 g.

Example 7

Example 7 was carried out as described in Example 1 except that the paste was prepared using 52 wt % Ag, 4.5 wt % Bi—Te—O, 40.75 wt % organic medium, 0.75 wt % Thixatrol®, and 2.0 wt % inorganic adhesion promoter made up of 1.0 wt % ZnO, 0.6 wt % $Bi_2O_3$ and 0.4 wt % Cu. The dried thickness of the sample was 6.9 μm.

Adhesion was determined for the sample of Example 7 as described in Example 1. The average adhesion for the as-prepared sample was 647 g.

Example 8

Example 8 was carried out as described in Example 1 except that the paste was prepared using 55 wt % Ag, 4.5 wt % Bi—Te—O, 37.75 wt % organic medium, 0.75 wt % Thixatrol®, and 2.0 wt % inorganic adhesion promoter made up of 1.0 wt % ZnO, 0.6 wt % $Bi_2O_3$ and 0.4 wt % Cu. The dried thickness of the sample was 6.4 μm.

Adhesion was determined for the sample of Example 8 as described in Example 1. The average adhesion for the as-prepared sample was 511 g.

What is claimed is:

1. A bismuth-tellurium-oxide composition consisting of:
    22-42 wt % $Bi_2O_3$ 58-78 wt % $TeO_2$, 0.1-7 wt % $Li_2O$ and 0.1-4 wt % $TiO_2$, based on the total weight of said bismuth-tellurium oxide.

2. The bismuth-tellurium-oxide composition of claim 1, said bismuth-tellurium oxide consisting of:
    22-42 wt % $Bi_2O_3$, 58-78 wt % $TeO_2$, 0.9-5 wt % $Li_2O$ and 0.3-2 wt % $TiO_2$, based on the total weight of said bismuth-tellurium oxide.

3. A bismuth-tellurium-oxide composition consisting of:
    22-42 wt % $Bi_2O_3$, 58-78 wt % $TeO_2$, 0.1-7 wt % $Li_2O$, 0.1-4 wt % $TiO_2$, 0.1-8 wt % $B_2O_3$, 0.1-3 wt % ZnO and 0.3-2 wt % $P_2O_5$, based on the total weight of said bismuth-tellurium oxide.

4. The bismuth-tellurium-oxide composition of claim 3, said bismuth-tellurium oxide consisting of:
    22-42 wt % $Bi_2O_3$, 58-78 wt % $TeO_2$, 0.1-7 wt % $Li_2O$. 0.1-4 wt % $TiO_2$, 0.9-6 wt % $B_2O_3$, 0.1-2 wt % ZnO and 0.3-1 wt % $P_2O_5$, based on the total weight of said bismuth-tellurium oxide.

5. The bismuth-tellurium-oxide composition of claim 4, said bismuth-tellurium oxide consisting of:
    22-42 wt % $Bi_2O_3$, 58-78 wt % $TeO_2$, 0.9-5 wt % $Li_2O$, 0.3-2 wt % $TiO_2$, 0.9-6 wt % $B_2O_3$, 0.1-2 wt % ZnO and 0.3-1 wt % $P_2O_5$; based on the total weight of said bismuth-tellurium oxide.

6. The bismuth-tellurium-oxide composition of claim 5, said bismuth-tellurium oxide consisting of:
    26.64 wt % $Bi_2O_3$, 67.22 wt % $TeO_2$, 2.16 wt % $Li_2O$, 0.48 wt % $TiO_2$, 2.09 wt % $B_2O_3$, 0.98 wt % ZnO and 0.43 wt % $P_2O_5$, based on the total weight of said bismuth-tellurium oxide.

7. A bismuth-tellurium-oxide composition consisting of:
    22-42 wt % $Bi_2O_3$, 58-78 wt % $TeO_2$, 0.1-4 wt % $TiO_2$, 0.1-8 wt % $B_2O_3$, 0.1-3wt % ZnO, 0.3-2 wt % $P_2O_5$, and 0.1-7 wt % of one or more oxides selected from the group consisting of $Li_2O$, $Na_2O$, $K_2O$, $Cs_2O$ and $Rb_2O$, based on the total weight of said bismuth-tellurium oxide.

* * * * *